United States Patent
Lee et al.

(10) Patent No.: US 9,985,204 B2
(45) Date of Patent: May 29, 2018

(54) SEMICONDUCTOR MEMORY DEVICE

(71) Applicant: SAMSUNG ELECTRONICS CO., LTD., Suwon-Si, Gyeonggi-Do (KR)

(72) Inventors: Jinwoo Lee, Seoul (KR); Jeonghee Park, Hwaseong-si (KR); Dongho Ahn, Hwaseong-si (KR); Zhe Wu, Suwon-si (KR); Heeju Shin, Seoul (KR); Ja bin Lee, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days. days.

(21) Appl. No.: 15/451,961

(22) Filed: Mar. 7, 2017

(65) Prior Publication Data

US 2018/0019392 A1   Jan. 18, 2018

(30) Foreign Application Priority Data

Jul. 15, 2016   (KR) .................. 10-2016-0089980

(51) Int. Cl.
| | | |
|---|---|---|
| H01L 45/00 | (2006.01) |
| H01L 27/24 | (2006.01) |
| H01L 43/08 | (2006.01) |
| H01L 43/10 | (2006.01) |

(52) U.S. Cl.
CPC .......... *H01L 45/141* (2013.01); *H01L 43/08* (2013.01); *H01L 43/10* (2013.01); *H01L 45/06* (2013.01); *H01L 45/1233* (2013.01); *H01L 45/1253* (2013.01); *H01L 45/145* (2013.01); *H01L 45/16* (2013.01)

(58) Field of Classification Search
CPC .................. H01L 27/2427; H01L 45/141; H01L 45/1233
See application file for complete search history.

(56) References Cited

U.S. PATENT DOCUMENTS

| | | | |
|---|---|---|---|
| 8,227,785 B2 | 7/2012 | Erbetta | |
| 8,822,970 B2 | 9/2014 | Jung et al. | |
| 8,947,908 B2 | 2/2015 | Jo | |
| 9,118,008 B2 | 8/2015 | Zhou et al. | |
| 9,425,237 B2* | 8/2016 | Jo | H01L 45/085 |
| 2007/0090346 A1 | 4/2007 | Jeong et al. | |
| 2008/0042119 A1 | 2/2008 | Sandoval et al. | |
| 2009/0014704 A1* | 1/2009 | Chen | B82Y 10/00 257/3 |
| 2011/0240949 A1* | 10/2011 | Mitani | G11C 11/56 257/4 |

FOREIGN PATENT DOCUMENTS

| | | |
|---|---|---|
| JP | 2013055257 | 3/2013 |
| KR | 10-1480942 | 1/2015 |

* cited by examiner

*Primary Examiner* — Allison P Bernstein
(74) *Attorney, Agent, or Firm* — F. Chau & Associates, LLC

(57) ABSTRACT

A semiconductor memory device including first lines and second lines overlapping and intersecting each other, variable resistance memory elements disposed at intersections between the first lines and the second lines, and switching elements disposed between the variable resistance memory elements and the first lines. At least one of the switching elements includes first and second chalcogenide compound layers, and conductive nano-dots disposed between the first and second chalcogenide compound layers.

20 Claims, 13 Drawing Sheets

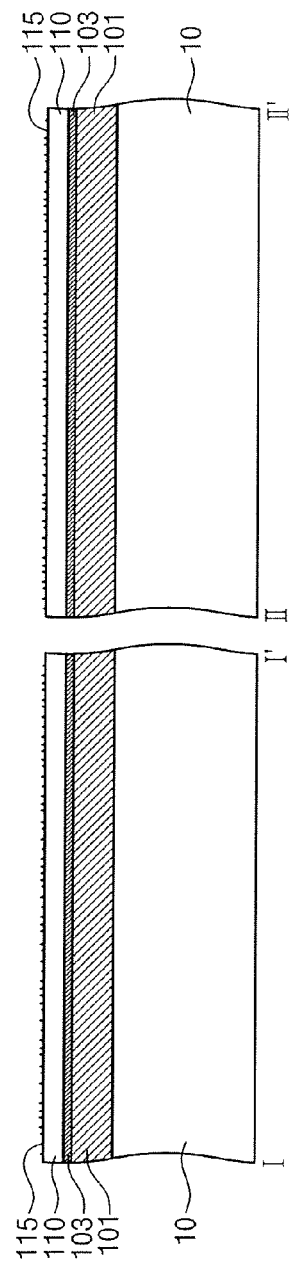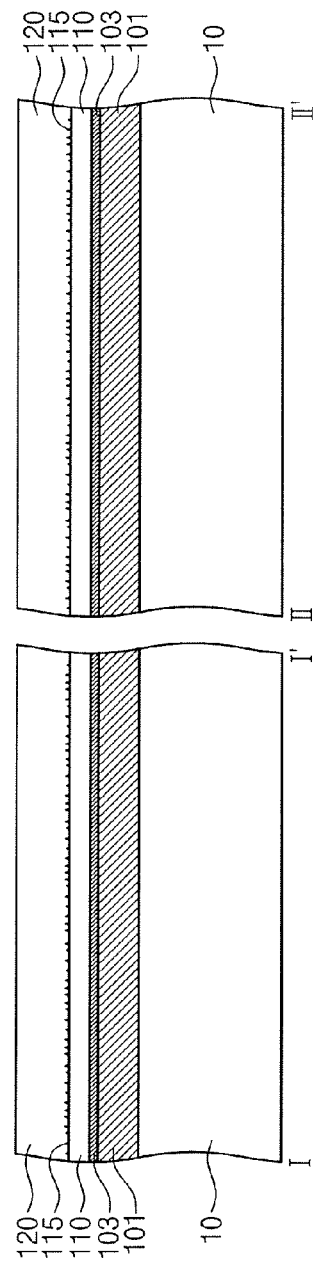

SEMICONDUCTOR MEMORY DEVICE

CROSS-REFERENCE TO RELATED APPLICATION

This U.S. non-provisional patent application claims priority under 35 U.S.C. § 119 to Korean Patent Application 10-2016-0089980, filed on Jul. 15, 2016 in the Korean Intellectual Property Office, the disclosure of which is incorporated by reference herein in its entirety.

TECHNICAL FIELD

The present inventive concept relates to a semiconductor memory device and, more particularly, to a variable resistance memory device.

DISCUSSION OF RELATED ART

Memory devices that are nonvolatile and do not require a refresh operation are being researched. Memory devices that have high integration characteristics like a Dynamic Random Access Memory (DRAM), nonvolatile characteristics of a Flash memory, and/or high speed of a Static RAM (SRAM) are being studied. Further, memory devices that have characteristics of a Phase change RAM (PRAM), a Nano Floating Gate Memory (NFGM), a Polymer RAM (PoRAM), a Magnetic RAM (MRAM), a Ferroelectric RAM (FeRAM), and/or a Resistive RAM (RRAM) are also being studied.

SUMMARY

According to exemplary embodiments of the present inventive concept, a semiconductor memory device may include first lines and second lines overlapping and intersecting each other; variable resistance memory elements disposed at intersections between the first lines and the second lines; and switching elements disposed between the variable resistance memory elements and the first lines. At least one of the switching elements includes first and second chalcogenide compound layers; and conductive nano-dots disposed between the first and second chalcogenide compound layers.

According to exemplary embodiments of the present inventive concept, a semiconductor memory device may include first lines and second lines overlapping and intersecting each other; variable resistance memory elements disposed at intersections between the first lines and the second lines; and threshold switching elements disposed between the variable resistance memory elements and the first lines. The threshold switching elements include conductive nano-dots.

According to exemplary embodiments of the present inventive concept, a semiconductor memory device may include: first lines and second lines overlapping and intersecting each other, in which the second lines are disposed over the first lines; variable resistance memory elements disposed at intersections between the first lines and the second lines; and switching elements disposed between the variable resistance memory elements and the first lines. At least one of the switching elements includes first, second, and third chalcogenide compound layers; first conductive nano-dots disposed between the first and second chalcogenide compound layers; and second conductive nano-dots disposed between the second and third chalcogenide compound layers.

BRIEF DESCRIPTION OF THE DRAWINGS

FIGS. 10A to 10E are cross sectional views taken along lines I-I' and II-II' of FIG. 3 illustrating a method of manufacturing a semiconductor memory device according to an exemplary embodiment of the present inventive concept.

DETAILED DESCRIPTION OF THE EMBODIMENTS

Hereinafter, a semiconductor memory device will be described with reference to the aforementioned figures according to one or more exemplary embodiments of the present inventive concept.

Figure 1:
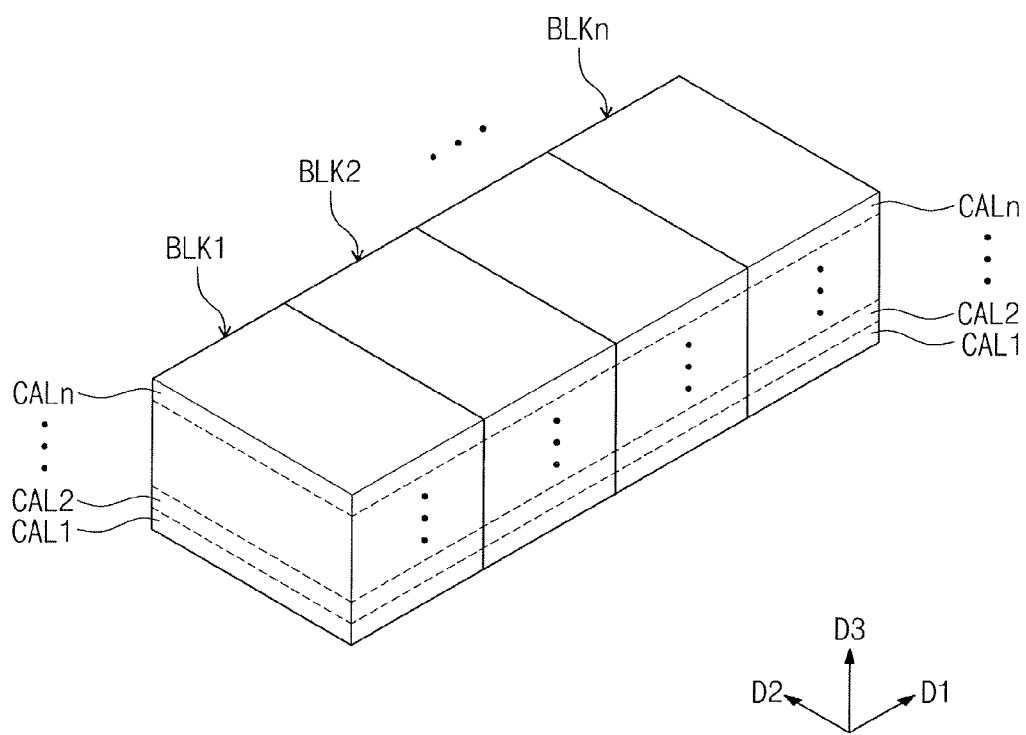
FIG. 1 is a block diagram illustrating a semiconductor memory device according to an exemplary embodiment of the present inventive concept.

FIG. 1 is a block diagram illustrating a semiconductor memory device according to an exemplary embodiment of the present inventive concept.

Referring to FIG. 1, a semiconductor memory device may include a memory cell array. The memory cell array may include a plurality of cell array blocks BLK1, BLK2, . . . , BLKn.

Each of the cell array blocks BLK1, BLK2, . . . , and BLKn may include a plurality of cell array layers CAL1, CAL2, . . . , and CALn. The cell array layers CAL1, CAL2, . . . , and CALn may be stacked in a third direction D3. The cell array layers CAL1, CAL2, . . . , and CALn may extend along a first direction D1 and a second direction D2 crossing each other. The third direction D3 may be substantially perpendicular to a plane extending along the first direction D1 and the second direction D2.

Each of the cell array layers CAL1, CAL2, . . . , and CALn may include a plurality of variable resistance memory cells. The variable resistance memory cells may be two-dimensionally arranged on each of the cell array layers CAL1, CAL2, . . . , and CALn. For example, the variable resistance memory cells may be arranged along the first direction D1 and the second direction D2 on each of the cell array layers CAL1, CAL2, . . . , and CALn.

Figure 2:
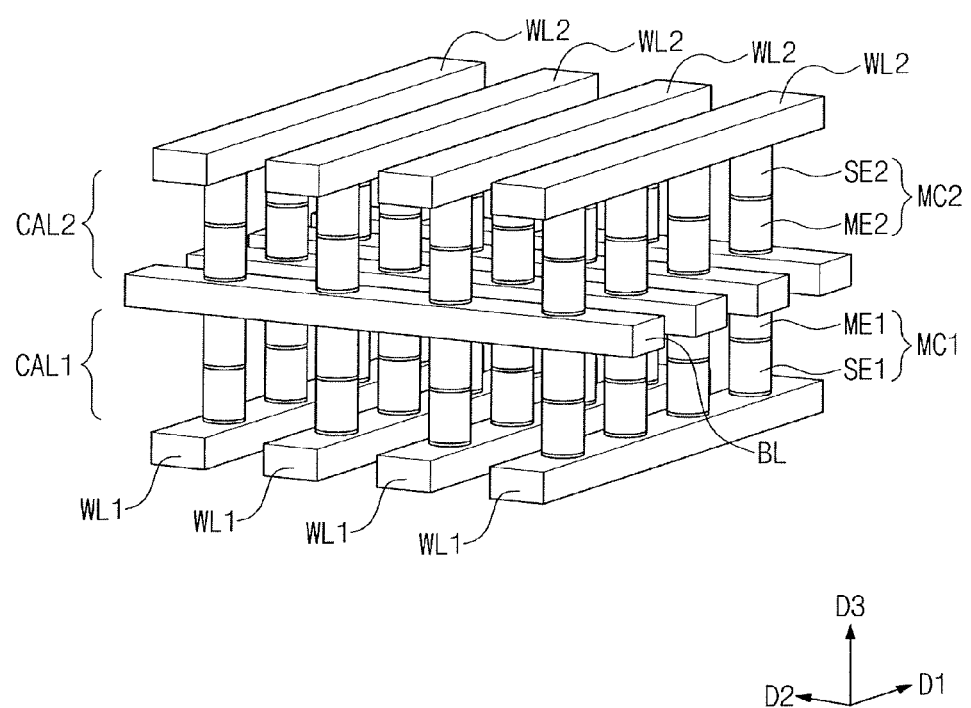
FIG. 2 is a perspective view illustrating a semiconductor memory device according to an exemplary embodiment of the present inventive concept.
Figure 3:
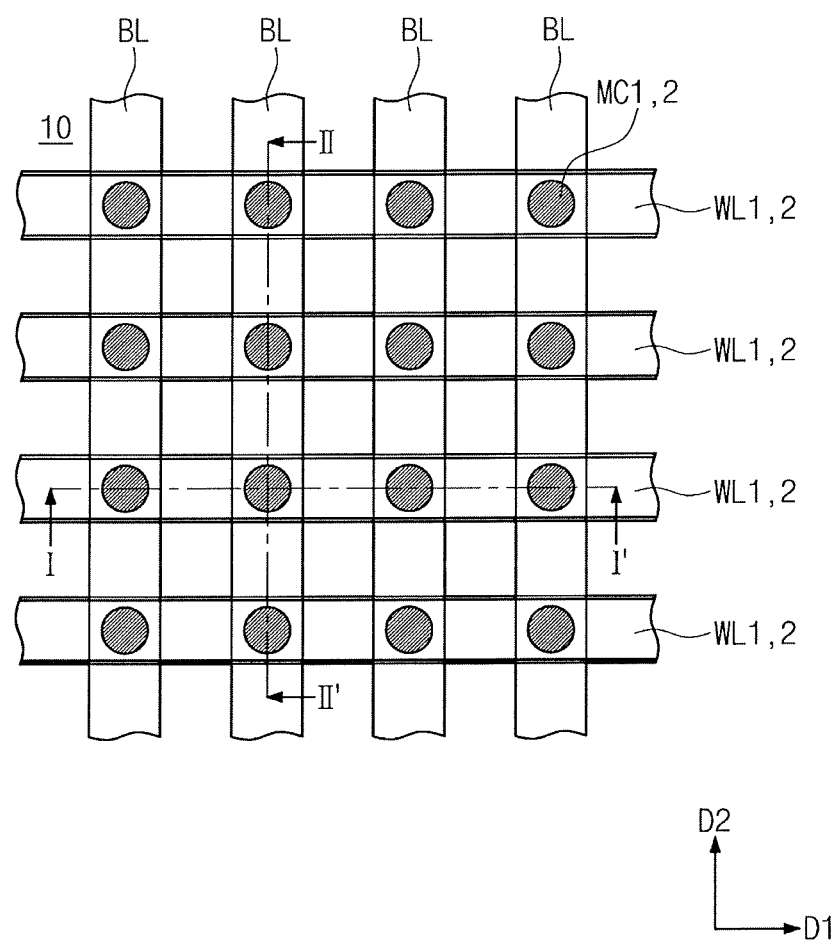
FIG. 3 is a plan view illustrating a semiconductor memory device according to an exemplary embodiment of the present inventive concept.

FIG. 2 is a perspective view illustrating a semiconductor memory device according to an exemplary embodiment of the present inventive concept. FIG. 3 is a plan view illustrating a semiconductor memory device according to an exemplary embodiment of the present inventive concept. FIGS. 4 to 7 are cross-sectional views taken along lines I-I' and II-II' of FIG. 3 according to an exemplary embodiment of the present inventive concept.

Figure 4:
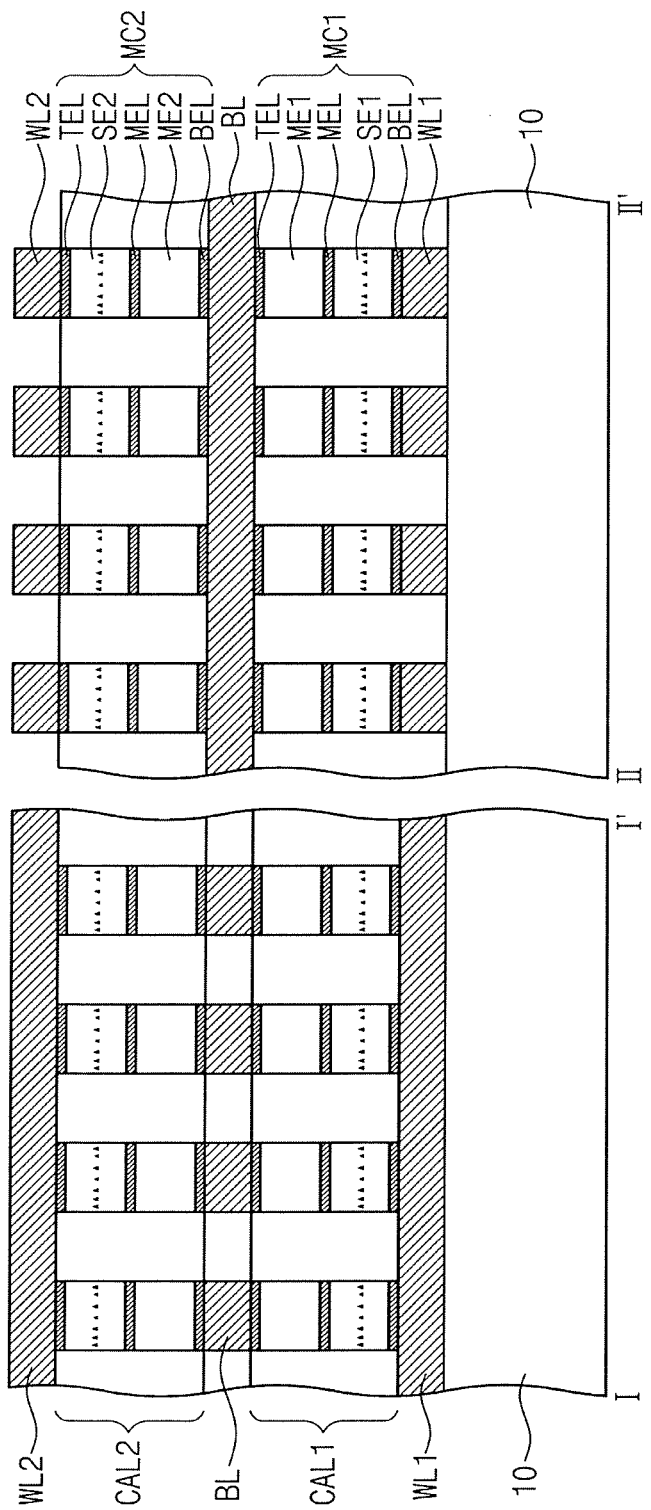
FIGS. 4 to 7 are cross sectional views taken along lines I-I' and II-II' of FIG. 3 illustrating a semiconductor memory device according to an exemplary embodiment of the present inventive concept.

Referring to FIGS. 2, 3 and 4, the semiconductor memory device may include a cross point memory cell array. The cross point memory cell array may include a plurality of first word lines WL1, a plurality of second word lines WL2, a plurality of bit lines BL, a plurality of first memory cells MC1, and a plurality of second memory cells MC2. The first memory cells MC1 and the second memory cells MC2 may be disposed at intersections between the first and second word lines WL1 and WL2 and the bit lines BL.

The first cell array layers CAL1 and the second cell array layers CAL2 may be stacked along the third direction D3. As illustrated in FIGS. 2, 3 and 4, the semiconductor memory device may include two stacked cell array layers; however, exemplary embodiments of the present inventive concept are not limited thereto. For example, the semiconductor memory device may include more than two cell array layers. The more than two cell array layers may be stacked in the third direction D3 as described with reference to FIG. 1. When the semiconductor memory device includes more than two cell array layers, the first cell array layers CAL1 and the second cell array layers CAL2 may be alternately and repeatedly stacked on a substrate 10.

According to an exemplary embodiment of the present inventive concept, the substrate 10 may be a semiconductor substrate. The semiconductor substrate may include silicon, germanium, and/or silicon-germanium. The substrate 10 may be a bulk silicon substrate, a silicon-on-insulator (SOI) substrate, a germanium substrate, a germanium-on-insulator (GOI) substrate, a silicon-germanium substrate, or an epitaxial layer substrate obtained by performing a selective epitaxial growth (SEG). Alternatively, the substrate 10 may be an insulation layer. The insulation layer may be a silicon oxide layer, a silicon nitride layer, or a low-k dielectric layer, etc.

The first cell array layer CAL1 may be disposed between the first word lines WL1 and the bit lines BL. The first word lines WL1 and the bit lines BL may cross each other. The second cell array layers CAL2 may be disposed between the second word lines WL2 and the bit lines BL. The second word lines WL2 and the bit lines BL may cross each other.

The first word lines WL1 and the second word lines WL2 may extend in the first direction D1. The first word lines WL1 and the second word lines WL2 may be positioned at different levels from each other. The bit lines BL may extend in the second direction D2. The bit lines BL may run across the first word lines WL1 and the second word lines WL2. The first cell array layers CAL1 and the second cell array layers CAL2 may share the bit lines BL.

According to an exemplary embodiment of the present inventive concept, as illustrated in FIG. 4, the first word lines WL1 may be disposed on the substrate 10. The second word lines WL2 may be disposed apart from the first word lines WL1. The second word lines WL2 may be vertically spaced apart from the first word lines WL1, e.g., in the third direction D3. The bit lines BL may be disposed between the first word lines WL1 and the second word lines WL2, as viewed in a vertical cross-section.

The first word lines WL1, the bit lines BL, and the second word lines WL2 may include a doped semiconductor material (e.g., doped silicon), a metal (e.g., tungsten, aluminum, titanium, and/or tantalum), a conductive metal nitride (e.g., titanium nitride, tantalum nitride, and/or tungsten nitride), a metal-semiconductor compound (e.g., metal silicide), or any combination thereof.

The first cell array layer CAL1 may include the first memory cells MC1. The first memory cells MC1 may be disposed at intersections between the first word lines WL1 and the bit lines BL. The second cell array layer CAL2 may include the second memory cells MC2. The second memory cells MC2 may be disposed at intersections between the second word lines WL2 and the bit lines BL. According to some exemplary embodiments of the present inventive concept, the first memory cells MC1 and the second memory cells MC2 may share the bit lines BL. According to some exemplary embodiments of the present inventive concept, one of the first memory cells MC1 and the second memory cells MC2 may include one of the bit lines BL and one of the first and second word lines WL1 and WL2.

Each of the first and second memory cells MC1 and MC2 may include first and second memory elements ME1 and ME2, respectively. Each of the first and second memory cells MC1 and MC2 may also include first and second switching elements SE1 and SE2. The first and second memory elements ME1 and ME2 may be electrically connected to the first and second switching elements SE1 and SE2, respectively. In each of the first and second memory cells MC1 and MC2, the first and second switching element SE1 and SE2 and the first and second memory element ME1 and ME2 may be disposed between a bottom electrode BEL and a top electrode TEL. A middle electrode MEL may be interposed between the first and second switching elements SE1 and SE2 and the first and second memory elements ME1 and ME2.

For example, the first and second memory elements ME1 and ME2 may be connected between the bit lines BL and the first and second switching elements SE1 and SE2. The first and second switching elements SE1 and SE2 may be connected between the first and second memory elements ME1 and ME2 and one of the first and second word lines WL1 and WL2. Alternatively, the first and second memory elements ME1 and ME2 may be connected between the first and second switching elements SE1 and SE2 and one of the word lines WL1 and WL2. The first and second switching elements SE1 and SE2 may be connected between the first and second memory elements ME1 and ME2 and the bit lines BL.

As illustrated in FIG. 4, the first and second memory elements ME1 and ME2 of the first and second memory cells MC1 and MC2 may be disposed adjacent to the bit lines BL. The first switching elements SE1 of the first memory cells MC1 may be disposed adjacent to the first word lines WL1. The second switching elements SE2 of the second memory cells MC2 may be disposed adjacent to the second word lines WL2.

Figure 5:
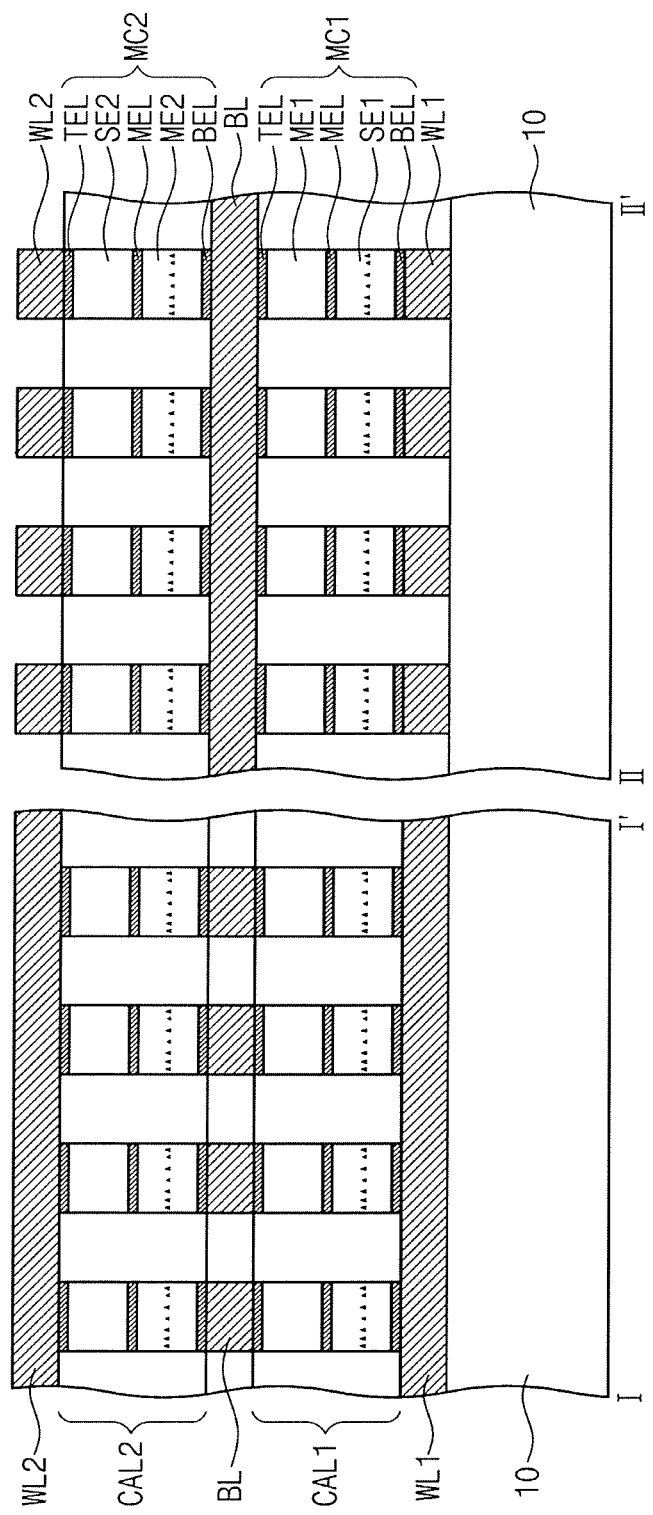

Alternatively, as illustrated in FIG. 5, the first memory elements ME1 of the first memory cells MC1 may be disposed adjacent to the bit lines BL. The second switching elements SE2 of the second memory cells MC2 may be disposed adjacent to the bit lines BL. The first switching elements SE1 of the first memory cells MC1 may be disposed adjacent to the first word lines WL1. The second memory elements ME2 of the second memory cells MC2 may be disposed adjacent to the second word lines WL2.

Figure 6:
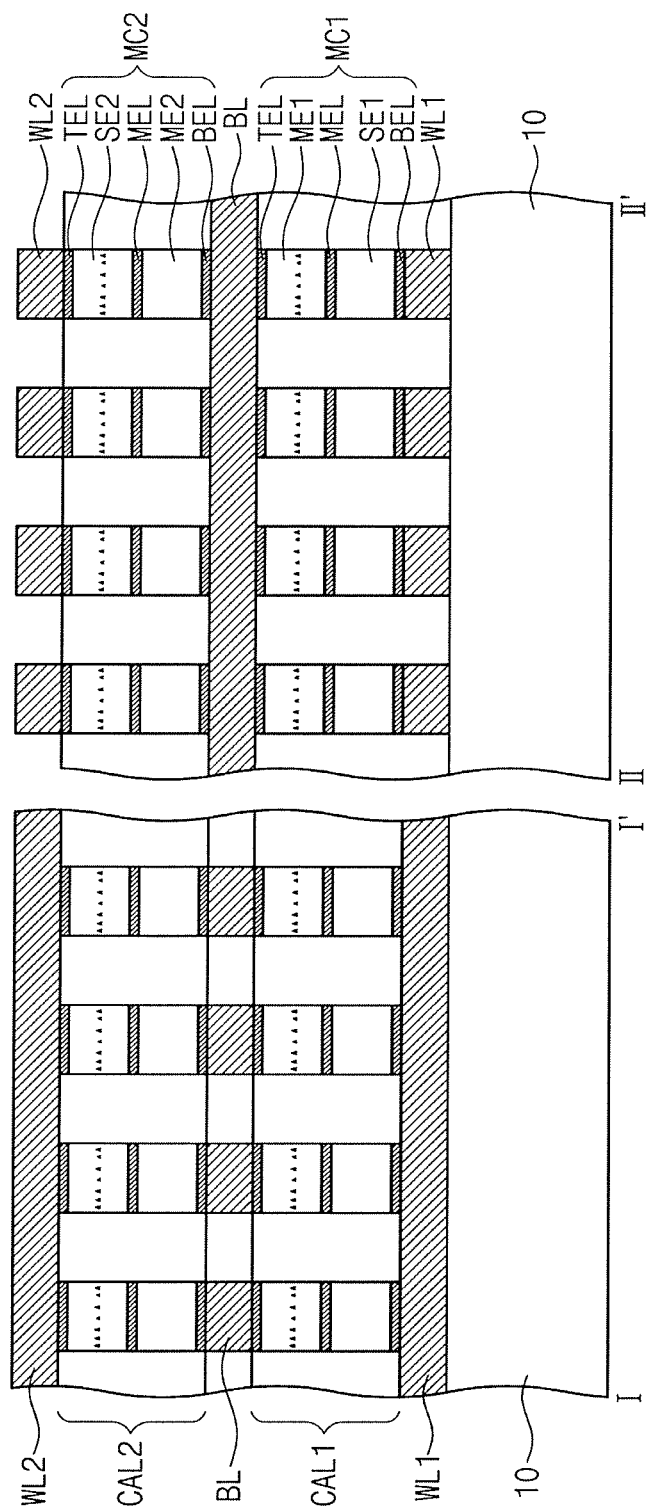

As illustrated in FIG. 6, the first switching elements SE1 of the first memory cells MC1 may be disposed adjacent to the bit lines BL. The second memory elements ME2 of the second memory cells MC2 may be disposed adjacent to the bit lines BL. The first memory elements ME1 of the first memory cells MC1 may be disposed adjacent to the first word lines WL1. The second switching elements SE2 of the second memory cells MC2 may be disposed adjacent to the second word lines WL2.

Figure 7:
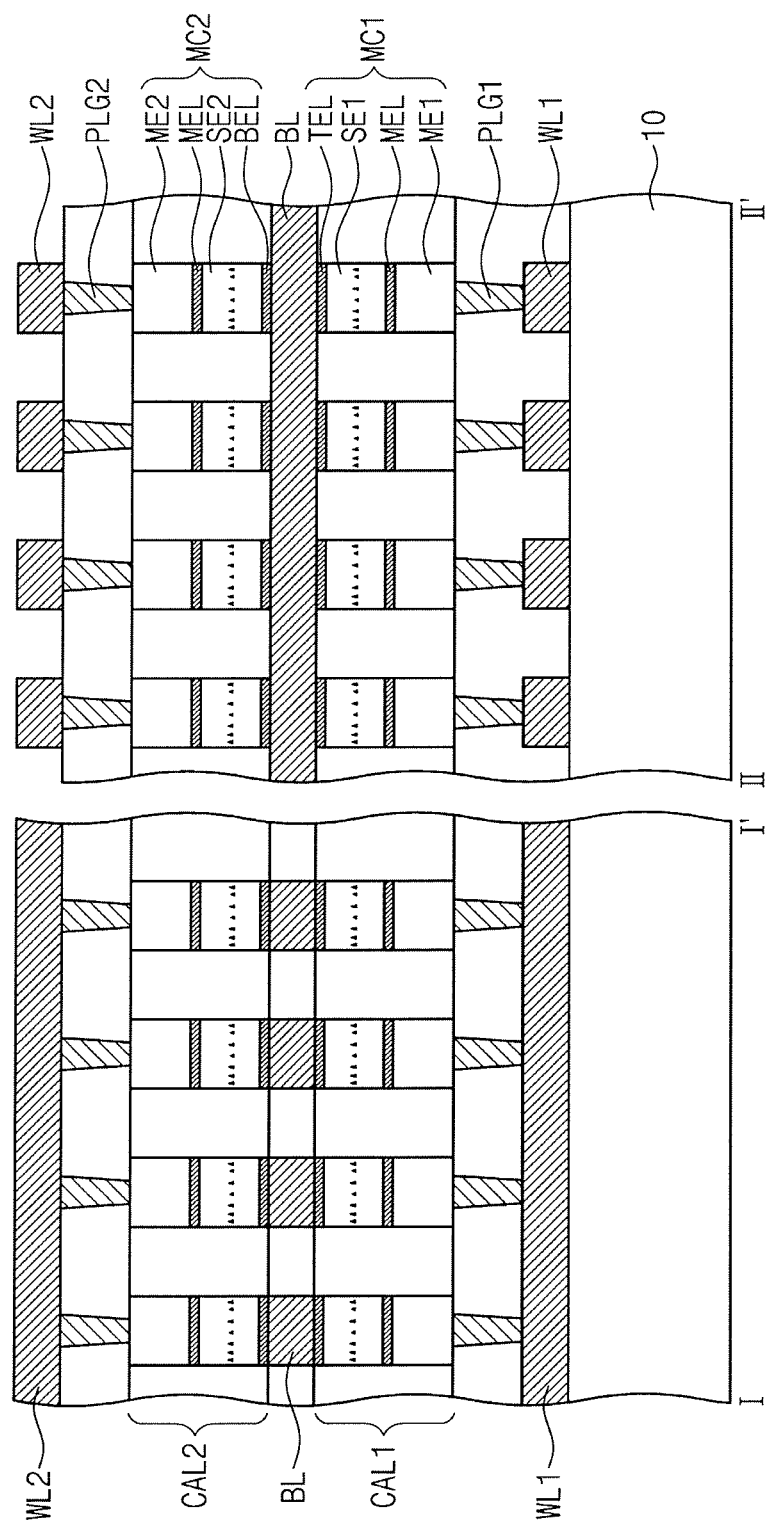

In some exemplary embodiments of the present inventive concept, as illustrated in FIG. 7, the first and second memory elements ME1 and ME2 of the first and second memory cells MC1 and MC2 may be electrically connected to the first and second word lines WL1 and WL2. The first and second memory elements ME1 and ME2 of the first and second memory cells MC1 and MC2 may be electrically connected to the first and second word lines WL1 and WL2 through first and second contact plugs PLG1 and PLG2, respectively. For example, the first and second memory elements ME1 and ME2 of the first and second memory cells MC1 and MC2 may be in direct contact with the first and second contact plugs PLG1 and PLG2, respectively. The first and second contact plugs PLG1 and PLG2 may be a heater electrode. The heater electrode may provide Joule's heat to the first and second memory elements ME1 and ME2. The heater electrode may also include a phase change material.

Referring to FIGS. 2 and 3, the first and second memory elements ME1 and ME2 may each include a variable resistance layer. The variable resistance layer may be switched from one to the other of its two resistance states by an applied electrical pulse. The variable resistance layer may include a material. The material may be capable of being switched between a plurality of states. The plurality of states may have resistances different from each other.

For example, the variable resistance layer may include a phase change material having a crystalline state. The crystalline state may be changed depending on a temperature and/or supply time of heat. The phase change material may have an amorphous state. The amorphous state may have a relatively high resistance depending on a temperature of the phase change material. The phase change material may also have a crystal state. The crystal state may have a relative low resistance depending on a temperature of the phase change material. For example, the phase change material may have a phase transition temperature. The phase transition temperature may be the temperature required to induce a phase transition between the crystal state and the amorphous states. The phase transition temperature may be in a range from about 250° C. to about 350° C. For example, the phase change material may include a compound including tellurium (Te) or selenium (Se) as chalcogen elements. The compound may also include germanium (Ge), antimony (Sb), bismuth (Bi), lead (Pb), tin (Sn), silver (Ag), arsenic (As), sulfur (S), silicon (Si), indium (In), titanium (Ti), gallium (Ga), phosphorus (P), oxygen (O), or carbon (C). The phase change material may include GeSbTe, GeTeAs, SbTeSe, GeTe, SbTe, SeTeSn, GeTeSe, SbSeBi, GeBiTe, GeTeTi, InSe, GaTeSe, or InSbTe. According to an exemplary embodiment of the present inventive concept, the variable resistance layer may include a superlattice structure. The superlattice structure may include a layer including Ge and a layer omitting Ge. The layer including Ge and the layer omitting Ge may be repeatedly stacked. For example, the variable resistance layer may include a structure in which a GeTe layer and a SbTe layer are repeatedly stacked.

Alternatively, the variable resistance layer may include a material. The material may have a resistance value. The resistance value may be changed depending on formation or destruction of a filament and/or bridge. For example, the variable resistance layer may include a perovskite compound or transition metal oxide. Alternatively, the variable resistance layer may include a magnetic tunnel junction. The magnetic tunnel junction may have a resistance value. The resistance value may be changed depending on magnetization directions of free layers and fixed layers.

In some exemplary embodiments of the present inventive concept, the first and second switching elements SE1 and SE2 may be a two-terminal switching device. The two-terminal switching device may have a threshold voltage. The first and second switching elements SE1 and SE2 may be a device based on a threshold switching phenomenon having a nonlinear I-V curve (e.g., S-type I-V curve). For example, the first and second switching element SE1 and SE2 may be an Ovonic Threshold Switch (OTS) device having bi-directional characteristics.

In some exemplary embodiments of the present inventive concept, the first and second switching elements SE1 and SE2 may include a chalcogenide compound. The chalcogenide compound may include Te and/or Se as chalcogen elements. The chalcogenide compound may also include Ge, Sb, Bi, Al, Pb, Sn, Ag, As, S, Si, In, Ti, Ga, or P. The chalcogenide compound may include AsTe, AsSe, GeTe, SnTe, GeSe, SnTe, SnSe, ZnTe, AsTeSe, AsTeGe, AsSeGe, AsTeGeSe, AsSeGeSi, AsSeGeC, AsTeGeSi, AsTeGeS, AsTeGeSiIn, AsTeGeSiP, AsTeGeSiSbS, AsTeGeSiSbP, AsTeGeSeSb, AsTeGeSeSi, AsTeGeSiSeNS, SeTeGeSi, GeSbTeSe, GeBiTeSe, GeAsSbSe, GeAsBiTe, or GeAsBiSe.

In some exemplary embodiments of the present inventive concept, when the first and second memory elements ME1 and ME2 are formed of a phase change material, the first and second switching elements SE1 and SE2 may have a phase transition temperature greater than a phase transition temperature of the phase change material. For example, the first and second switching elements SE1 and SE2 may have a phase transition temperature of from about 350° C. to about 450° C. Therefore, when operating a semiconductor memory device according to an exemplary embodiment of the present inventive concept, the first and second memory elements ME1 and ME2 may be reversibly changed between its crystal and amorphous states under an operating voltage. Additionally, the first and second switching elements SE1 and SE2 may maintain its substantially amorphous state without the phase transition under an operating voltage. The substantially amorphous state may not exclude the presence of a locally crystalline grain boundary or a locally crystalline portion in a target (e.g., the first and second switching elements SE1 and SE2).

In some exemplary embodiments of the present inventive concept, when an electric field below threshold voltage is applied to the first and second switching elements SE1 and SE2 consisting of a chalcogenide compound (e.g., in an off state), electrons may occupy deep trap states below the Fermi level. Thus, a movement of electrons may be restricted.

When a high potential above threshold voltage is applied to the first and second switching elements SE1 and SE2, electrons may hop (e.g., jump) from trap to trap to access empty shallow trap states by thermal emmition or tunneling processes. The movement or hopping of electrons between traps may produce a current flow across the first and second switching elements SE1 and SE2.

In some exemplary embodiments of the present inventive concept, the first and second switching elements SE1 and SE2 including a chalcogenide compound may include conductive nano-dots. The conductive nano-dots may be positioned in the first and second switching elements SE1 and SE2. The conductive nano-dots may be spaced apart from the bottom electrodes BEL, middle electrodes MEL, and top electrodes TEL. In addition, the conductive nano-dots may have an island shape. The conductive nano-dots may be non-uniformly or uniformly distributed at the same distance from bottom surfaces of the first and second switching elements SE1 and SE2.

The conductive nano-dots may be composed of an amorphous material or a crystalline metal material. The conductive nano-dots may have a size of about 1 nm to about 10 nm. The conductive nano-dots may include tellurium (Te), arsenic (As), silver (Ag), ruthenium (Ru), titanium (Ti), tantalum (Ta), tungsten (W), aluminum (Al), silicon (Si), or germanium (Ge)

In some exemplary embodiments of the present inventive concept, when the first and second switching elements SE1 and SE2 include a chalcogenide compound, the conductive nano-dots may include one element including the chalcogenide compound. For example, the conductive nano-dots may be tellurium (Te) nano-dots. Alternatively, the conductive nano-dots may be ruthenium (Ru) nano-dots or silver (Ag) nano-dots.

In some exemplary embodiments of the present inventive concept, as the first and second switching elements SE1 and SE2 include the conductive nano-dots, an electric field applied to the first and second switching elements SE1 and SE2 may be confined to the conductive nano-dots when a semiconductor memory device is operated. Therefore, when a semiconductor memory device is operated, electrons may move along the conductive nano-dots so that uniform movement paths of electrons may be attained. As a result, the first and second switching elements SE1 and SE2 may have an increased distribution of threshold voltage.

Switching elements will be further described in detail below with reference to FIGS. 8A and 8B according to an exemplary embodiment of the present inventive concept.

Figure 8A:
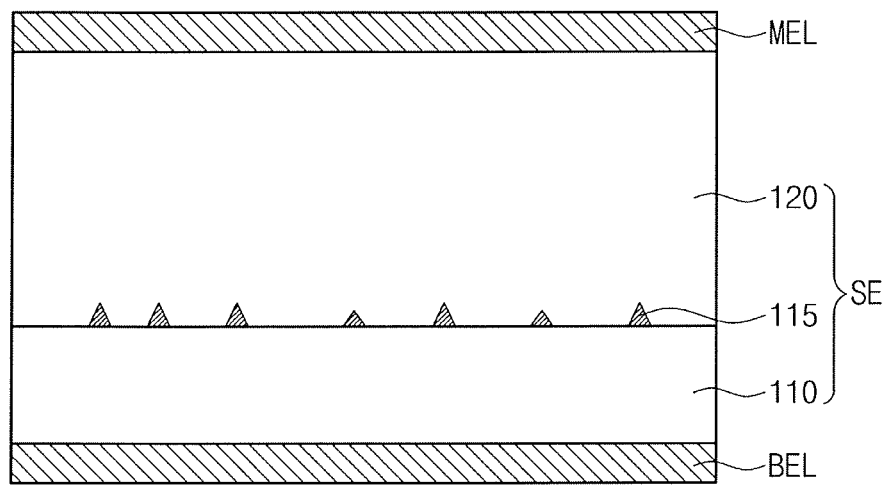
FIGS. 8A and 8B illustrate a switching element according to an exemplary embodiment of the present inventive concept.
Figure 8B:
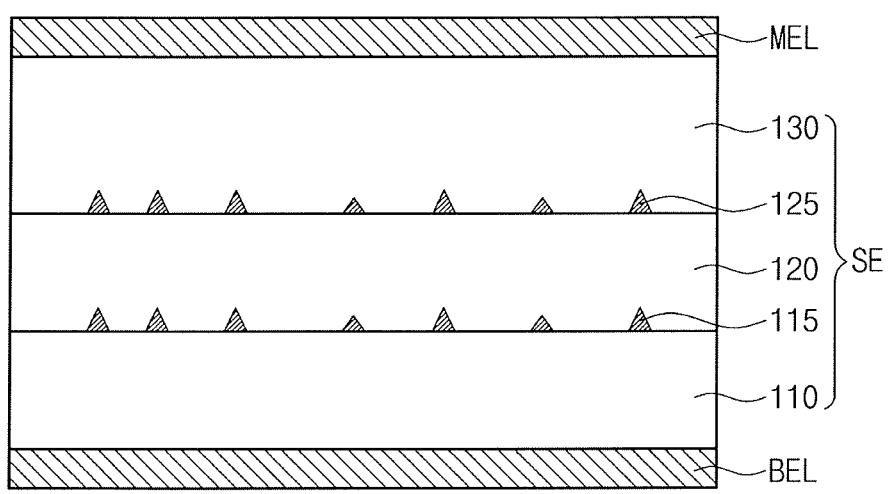

FIGS. 8A and 8B illustrate a switching element according to an exemplary embodiment of the present inventive concept.

Referring to FIG. 8A, a switching element SE may include first and second chalcogenide compound layers 110 and 120. The first and second chalcogenide layers 110 and 120 may be sequentially stacked. The switching element SE may also include conductive nano-dots 115. The conductive nano-dots 115 may be positioned at an interface between the first and second chalcogenide compound layers 110 and 120. The first and second chalcogenide compound layers 110 and 120 may be disposed between a pair of electrodes (e.g., a bottom electrode BEL and a middle electrode MEL). The first and second chalcogenide compound layers 110 and 120 may be spaced apart from the bottom electrode BEL and the middle electrode MEL.

The first and second chalcogenide compound layers 110 and 120 may be include a compound. The compound may include Te and/or Se as chalcogen elements. The compound may also include Ge, Sb, Bi, Al, Pb, Sn, Ag, As, S, Si, In, Ti, Ga, or P. The first and second chalcogenide compound layers 110 and 120 may maintain their amorphous states when a semiconductor memory device is operated.

The first and second chalcogenide compound layers 110 and 120 may further include a thermal stabilizing element. The thermal stabilizing element may be C, N and/or 0. For example, the first and second chalcogenide compound layers 110 and 120 may include AsTe, AsSe, GeTe, SnTe, GeSe, SnTe, SnSe, ZnTe, AsTeSe, AsTeGe, AsSeGe, AsTeGeSe, AsSeGeSi, AsSeGeC, AsTeGeSi, AsTeGeS, AsTeGeSiIn, AsTeGeSiP, AsTeGeSiSbS, AsTeGeSiSbP, AsTeGeSeSb, AsTeGeSeSi, AsTeGeSiSeNS, SeTeGeSi, GeSbTeSe, GeBiTeSe, GeAsSbSe, GeAsBiTe, or GeAsBiSe.

In some exemplary embodiments of the present inventive concept, the first and second chalcogenide compound layers 110 and 120 may include nitrogen. A nitrogen concentration in the first chalcogenide compound layer 110 may be greater than a nitrogen concentration in the second chalcogenide compound layer 120. For example, the first and second chalcogenide compound layers 110 and 120 may have a nitrogen concentration ranging from about 3.0% to about 5.0% and from about 1.0% to about 2.0%, respectively.

The first chalcogenide compound layer 110 may have a thickness less than a thickness of the second chalcogenide compound layer 120. A substrate 10 of FIG. 4 may be closer to the first chalcogenide compound layer 110 than to the second chalcogenide compound layer 120. For example, each of the first and second switching elements SE1 and SE2 of the first and second memory cells MC1 and MC2 described with reference to FIGS. 4 to 7 may include the first and second chalcogenide compound layers 110 and 120. The substrate 10 may be disposed closer to the first chalcogenide compound layer 110 than to the second chalcogenide compound layer 120.

In some exemplary embodiments of the present inventive concept, the first and second chalcogenide compound layers 110 and 120 may be formed using a sputtering process, a physical vapor deposition (PVD) process, a chemical vapor deposition (CVD) process, a metal organic chemical vapor deposition (MOCVD) process, or a plasma enhanced chemical vapor deposition (PECVD) process.

In some exemplary embodiments of the present inventive concept, the conductive nano-dots 115 may be non-uniformly distributed on a surface of the first chalcogenide compound layer 110. The second chalcogenide compound layer 120 may cover the conductive nano-dots 115. For example, the conductive nano-dots 115 may be positioned at an interface between the first and second chalcogenide compound layers 110 and 120. The conductive nano-dots 115 may be composed of an amorphous material or a crystalline metal material. The conductive nano-dots 115 may include, for example, at Te, As, Ag, Ru, Ti, Ta, W, Si, Ge, or Al. In some exemplary embodiments of the present inventive concept, the conductive nano-dots 115 may be Te nano-dots. The Te nano-dots may be formed by segregation of Te elements included in the first chalcogenide compound layer 110.

Referring to FIG. 8B, the switching element SE may include a first chalcogenide compound layer 110, a second chalcogenide compound layer 120, and a third chalcogenide compound layer 130. The first to third chalcogenide compound layers 110, 120 and 130 may be sequentially stacked. The switching element SE may also include first conductive nano-dots 115. The first conductive nano-dots 115 may be positioned at an interface between the first and second chalcogenide compound layers 110 and 120. The switching element SE may also include second conductive nano-dots 125. The second conductive nano-dots 125 may be positioned at an interface between the second and third chalcogenide compound layers 120 and 130. The first to third chalcogenide compound layers 110, 120 and 130 may be sequentially stacked between a pair of electrodes (e.g., a bottom electrode BEL and a middle electrode MEL).

In some exemplary embodiments of the present inventive concept, the first to third chalcogenide compound layers 110, 120 and 130 may include nitrogen. The first and second chalcogenide compound layers 110 and 120 may have a nitrogen concentration greater than a nitrogen concentration of the third chalcogenide compound layer 130. For example, the first and second chalcogenide compound layers 110 and 120 may have a nitrogen concentration ranging from about 3.0% to about 5.0%, and the third chalcogenide compound layer 130 may have a nitrogen concentration from about 1.0% to about 2.0%.

In some exemplary embodiments of the present inventive concept, the first and second chalcogenide compound layers 110 and 120 may have substantially the same thickness. The third chalcogenide compound layer 130 may have a thickness greater than the thickness of the first and second chalcogenide compound layers 110 and 120.

In some exemplary embodiments of the present inventive concept, a substrate 10 of FIG. 4 may be closer to the first chalcogenide compound layer 110 than to the third chalcogenide compound layer 130. For example, each of the first and second switching elements SE1 and SE2 of the first and second memory cells MC1 and MC2 described with reference to FIGS. 4 to 7 may include the first to third chalcogenide compound layers 110, 120 and 130. The substrate 10 may be disposed closer to the first chalcogenide compound layer 110 than to the third chalcogenide compound layer 130.

In some exemplary embodiments of the present inventive concept, the first conductive nano-dots 115 may be non-uniformly distributed on a surface of the first chalcogenide compound layer 110. The second conductive nano-dots 125 may be non-uniformly distributed on a surface of the second chalcogenide compound layer 120.

In some exemplary embodiments of the present inventive concept, the first conductive nano-dots 115 may be Te nano-dots. The Te nano-dots may be formed by segregation of Te elements included in the first chalcogenide compound layer 110. The second conductive nano-dots 125 may be Te nano-dots. The Te nano-dots may be formed by segregation of Te elements included in the second chalcogenide compound layer 120.

Figure 9:
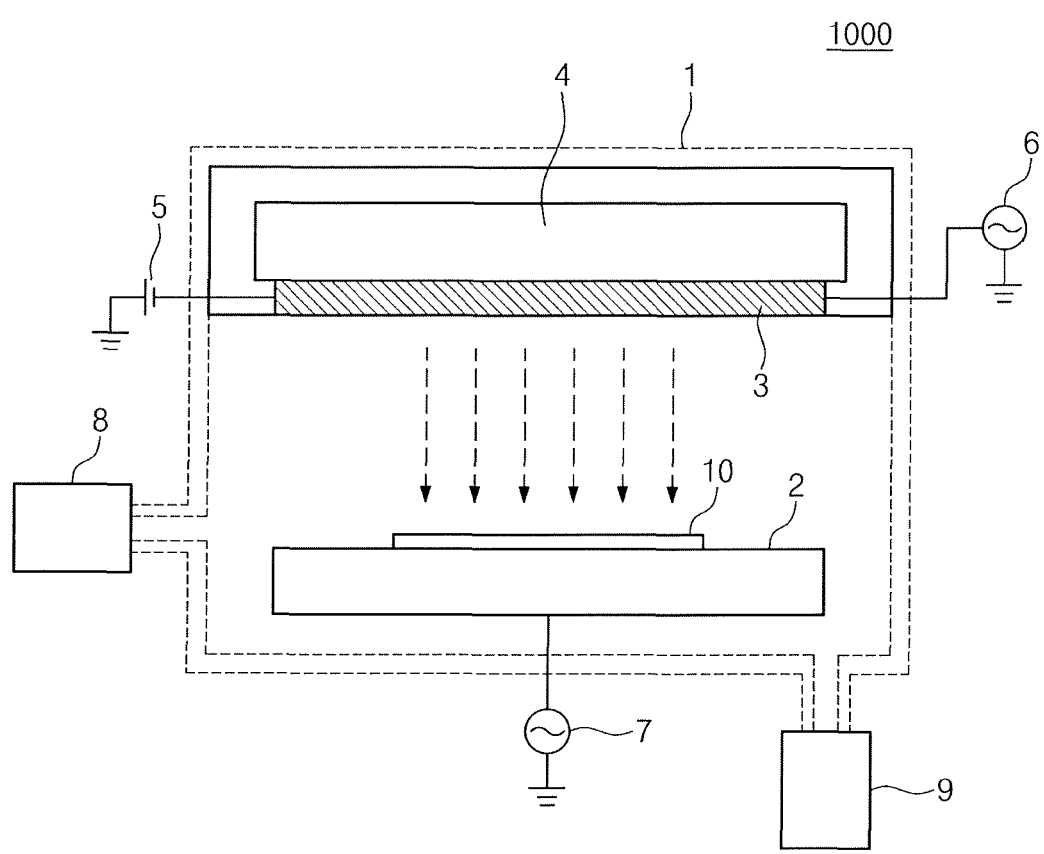
FIG. 9 illustrates a thin film deposition apparatus for fabricating a switching element of a semiconductor memory device according to an exemplary embodiment of the present inventive concept.

FIG. 9 illustrates a thin film deposition apparatus for fabricating a switching element of a semiconductor memory device according to an exemplary embodiment of the present inventive concept.

Referring to FIG. 9, a thin film deposition apparatus 1000 may include a chamber 1, a substrate holder 2, a chalcogenide target 3, a magnetron 4, power supply sources 5, 6 and 7, a gas supply source 8, and an exhaust unit 9.

A substrate 10 may be disposed on the substrate holder 2. The substrate holder 2 may be seated in the chamber 1. For example, the substrate 10 may include a bottom electrode described with reference to FIGS. 4 to 7.

The substrate holder 2 may serve as an electrostatic chuck or a lower electrode. At least one of AC power or DC power may be applied to the substrate holder 2 and the chalcogenide target 3.

The chalcogenide target 3 may be disposed to face the substrate holder 2. The chalcogenide target 3 may include a chalcogenide material. For example, the chalcogenide target 3 may include a compound. The compound may include Te or Se as chalcogenide elements, which may be combined with at least one of Ge, Sb, Bi, Al, Pb, Sn, Ag, As, S, Si, In, Ti, Ga or P. The chalcogenide target 3 may be connected to a first RF power source 6. The chalcogenide target 3 may be connected to a DC power source 5.

The magnetron 4 may be disposed on the chalcogenide target 3. The magnetron 4 may include a magnet array.

The chamber 1 may be connected to a gas supply source 8. The chamber 1 may be connected to a gas supply source 8 through a gas supply pipe. The gas supply source 8 may supply the chamber 1 with process gases used for depositing a thin film. For example, the chamber 1 may be supplied with process gases such as nitrogen, ammonia, oxygen, vapor (or water), and/or argon.

An exhaust pipe may be connected to the chamber 1. The chamber 1 may be connected to the exhaust unit 9. The chamber 1 may be connected to the exhaust unit 9 through an exhaust pipe. The exhaust unit 9 may include a vacuum pump such as a turbo pump. The chamber 1 may be adjusted to its inner processing space by the exhaust unit 9 in accordance with process condition.

FIGS. 10A to 10E are cross sectional views taken along lines I-I' and II-II' of FIG. 3 illustrating a method of fabricating a semiconductor memory device according to an exemplary embodiment of the present inventive concept.

Referring to FIG. 10A, the substrate 10 may be provided. A first conductive layer 101 for forming a first word line, a bottom electrode layer 103, and a first chalcogenide compound layer 110 may be formed on the substrate 10. For example, the first conductive layer 101, the bottom electrode layer 103, and the first chalcogenide compound layer 110 may be sequentially stacked on the substrate.

In some exemplary embodiments of the present inventive concept, the first conductive layer 101, the bottom electrode layer 103, and the first chalcogenide compound layer 110 may be formed to cover an entire surface of the substrate 10. The first conductive layer 101 and the bottom electrode layer 103 may be formed using a chemical vapor deposition (CVD) process, a metal organic chemical vapor deposition (MOCVD) process, or a plasma enhanced chemical vapor deposition (PECVD) process.

The first conductive layer 101 may include at least one of a doped semiconductor material (e.g., doped silicon), a metal (e.g., tungsten, aluminum, titanium, and/or tantalum), a conductive metal nitride (e.g., titanium nitride, tantalum nitride, and/or tungsten nitride), or a metal-semiconductor compound (e.g., metal silicide). The bottom electrode layer 103 may include]W, Ti, Ta, Al, C, CN, TiN, TiAlN, TiSiN, TiCN, WN, CoSiN, WSiN, TaN, TaCN, or TaSiN.

In some exemplary embodiments of the present inventive concept, the first chalcogenide compound layer 110 may be formed using the thin film deposition apparatus 1000 described with reference to FIG. 9. For example, a sputtering process may be employed to form the first chalcogenide compound layer 110 on the bottom electrode layer 103.

The substrate 10 including the bottom electrode 103 formed thereon may be placed on the substrate holder 2 of FIG. 9 in the chamber 1 of FIG. 9. An inside of the chamber 1 may be adjusted to a predetermined temperature and pressure condition. The predetermined temperature and pressure condition may be suitable for forming the first chalcogenide compound layer 110. The chamber 1 under a predetermined process condition may be supplied with inert gas and/or nitrogen gas. The inert gas may include argon gas, helium gas, or neon gas. Plasma may be generated in the chamber 1 so as to collide ionized inert gas with the chalcogenide target 3 of FIG. 9. Thus, chalcogenide elements may escape from the chalcogenide target 3 and may be deposited on a surface of the bottom electrode layer 103. Accordingly, the first chalcogenide compound layer 110 may be formed.

In some exemplary embodiments of the present inventive concept, when depositing the first chalcogenide compound layer 110, the chamber 1 may be provided with a nitrogen gas. The nitrogen gas may have a first concentration together with an argon gas as the inert gas. The first concentration may be in the range from about 3% to about 5%. In some exemplary embodiments of the present inventive concept, when nitrogen having a concentration of about 3% or more is provided when depositing the first chalcogenide compound layer 110, Te elements included in the first chalcogenide compound layer 110 may be segregated to form Te nano-dots 115 on a surface of the first chalcogenide compound layer 110.

Alternatively, the conductive nano-dots 115 may be formed using a separate process after the first chalcogenide compound layer 110 is formed. For example, after forming the first chalcogenide compound layer 110, the conductive nano-dots 115 may be formed by a rapid thermal process (RTP), a flash annealing process, and/or a laser annealing process.

Referring to FIG. 10B, a second chalcogenide compound layer 120 may be formed on the first chalcogenide compound layer 110. Thus, the second chalcogenide compound layer 120 may cover the conductive nano-dots 115.

In some exemplary embodiments of the present inventive concept, the second chalcogenide compound layers 120 may be formed in situ with the first chalcogenide compound layer 110. For example, the second chalcogenide compound layer 120 may be formed using the thin film deposition apparatus 1000 described with reference to FIG. 9.

In some exemplary embodiments of the present inventive concept, when forming the second chalcogenide compound layer 120, the chamber 1 may be supplied with a nitrogen gas. The nitrogen gas may have a second concentration less than the first concentration. The second concentration may be in the range from about 1% to about 2%. As a sputtering process is employed to deposit the second chalcogenide compound layer 120, the second chalcogenide compound layer 120 may cover the Te nano-dots 115 on the first chalcogenide compound layer 110. In some exemplary embodiments of the present inventive concept, the first chalcogenide compound layer 110 may be provided thereon with the second chalcogenide compound layer 120 that is deposited without segregation of Te elements.

Figure 10C:
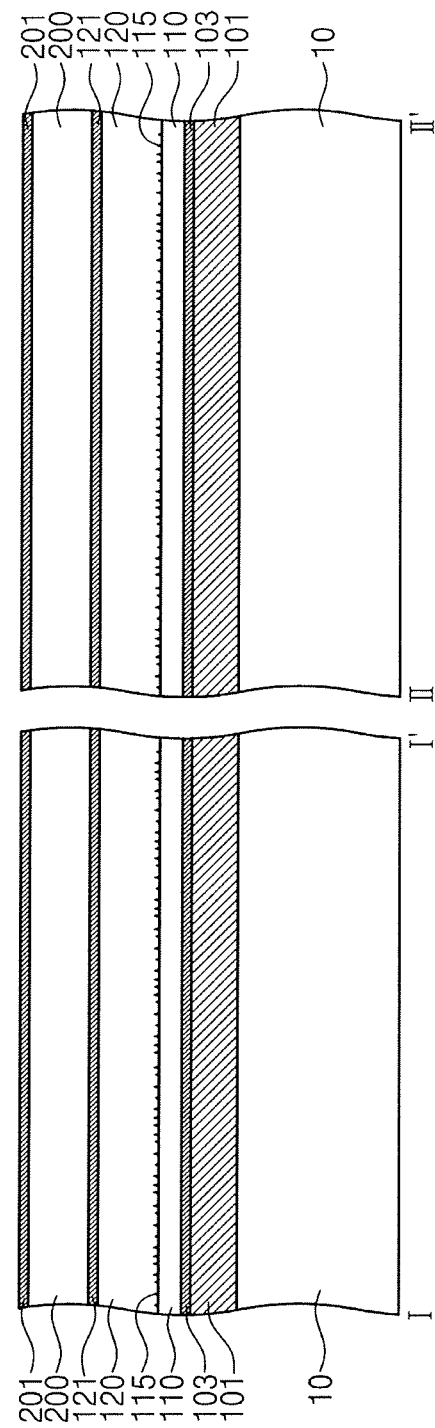

Referring to FIG. 10C, after forming the second chalcogenide compound layer 120, the second chalcogenide compound layer 120 may be provided thereon with a middle electrode layer 121, a variable resistance layer 200, and a top electrode layer 201. The middle electrode layer 121, the variable resistance layer 200, and the top electrode layer 201 may be formed on the second chalcogenide compound layer 120. For example, the middle electrode layer 121, the variable resistance layer 200, and the top electrode layer 201 may be sequentially stacked on the second chalcogenide compound layer 120.

The middle electrode layer 121 and the top electrode layer 201 may each include W, Ti, Ta, Al, C, CN, TiN, TiAlN, TiSiN, TiCN, WN, CoSiN, WSiN, TaN, TaCN, or TaSiN. The middle electrode layer 121 and the top electrode layer 201 may be formed using a chemical vapor deposition (CVD) process, a metal organic chemical vapor deposition (MOCVD) process, or a plasma enhanced chemical vapor deposition (PECVD) process.

In some exemplary embodiments of the present inventive concept, after forming the middle electrode layer 121, a process may be performed to form the variable resistance layer 200 including a phase change material. For example, the variable resistance layer 200 may be formed using the thin film deposition apparatus 1000 described with reference to FIG. 9. For example, the variable resistance layer 200 may be formed by a sputtering process using the chalcogenide target 3 of FIG. 9. Alternatively, the variable resistance layer 200 may be formed by a chemical vapor deposition (CVD) process or an atomic layer deposition (ALD) process.

Figure 10D:
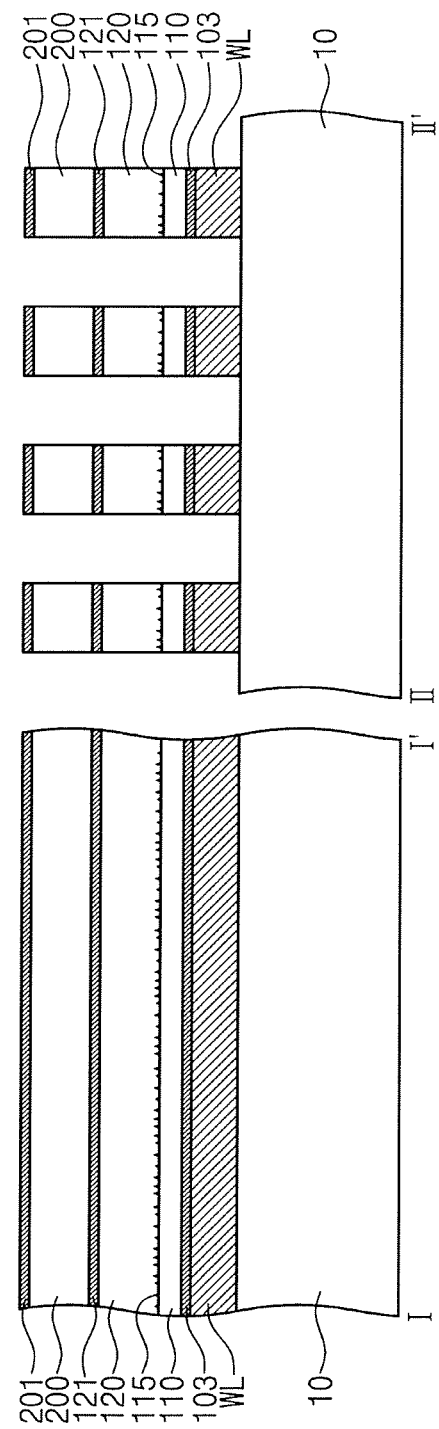

Referring to FIG. 10D, after forming the top electrode layer 201, word lines WL may be formed to extend in a first direction D1 by patterning the first conductive layer 101 of FIG. 10C together with the first and second chalcogenide compound layers 110 and 120 and the variable resistance layer 200. In some exemplary embodiments of the present inventive concept, when the word lines WL are formed, the first and second chalcogenide compound layers 110 and 120 and the variable resistance layer 200 may be simultaneously patterned as a line shape.

Figure 10E:
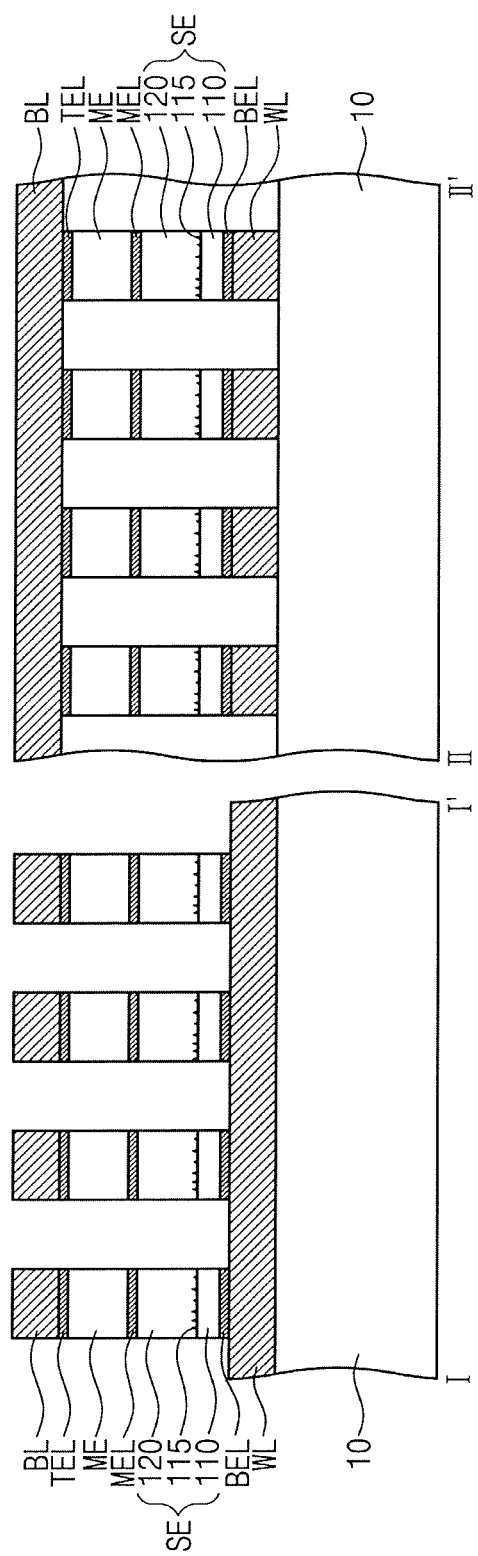

Referring to FIG. 10E, an interlayer dielectric layer may be formed between the word lines WL. The top electrode layer 201 may be provided on the interlayer dielectric layer with bit lines BL. The bit lines BL may be formed to run across the word lines WL.

The bit lines BL may be formed by depositing a second conductive layer on the interlayer dielectric layer and the top electrode layer 201 and then patterning the second conductive layer. After forming the bit lines BL, the line-shaped first and second chalcogenide compound layers 110 and 120 and the variable resistance layer 200 may be patterned using the bit lines BL as an etching mask. As a result, pillar-shaped switching elements SE may be formed. The switching elements SE may be spaced apart from each other on each of the word lines WL. Also, pillar-shaped variable resistance memory elements ME may be formed. The memory elements ME may be spaced apart from each other on each of the word lines WL.

According to exemplary embodiments of the present inventive concept, conductive nano-dots may be included in the switching element including a chalcogenide compound. Therefore, as an electric field applied to the switching element is confined to the conductive nano-dots when a semiconductor memory device is operated, it may be possible to improve characteristics (e.g., threshold voltage distribution) of the switching element including a chalcogenide compound.

Although the present inventive concept has been described in connection with the exemplary embodiments thereof. It will be apparent to those skilled in the art that various substitution, modifications, and changes may be thereto without departing from the scope and spirit of the inventive concept.

What is claimed is:

1. A semiconductor memory device, comprising:
   first lines and second lines overlapping and intersecting each other;
   variable resistance memory elements disposed at intersections between the first lines and the second lines; and
   switching elements disposed between the variable resistance memory elements and the first lines,
   wherein at least one of the switching elements comprises:
      first and second chalcogenide compound layers; and
      conductive nano-dots disposed between the first and second chalcogenide compound layers.

2. The semiconductor memory device of claim 1, wherein the first and second chalcogenide compound layers comprise nitrogen, the first chalcogenide compound layer including a nitrogen concentration greater than a nitrogen concentration of the second chalcogenide compound layer.

3. The semiconductor memory device of claim 1, wherein the first and second chalcogenide compound layers comprise an amorphous material.

4. The semiconductor memory device of claim 1, wherein the first chalcogenide compound layer has a thickness less than a thickness of the second chalcogenide compound layer.

5. The semiconductor memory device of claim 1, further comprising:
first electrodes disposed between the first lines and the switching elements;
second electrodes disposed between the second lines and the variable resistance memory elements; and
third electrodes disposed between the switching elements and the variable resistance memory elements.

6. The semiconductor memory device of claim 5, wherein the conductive nano-dots are spaced apart from the first electrode and the third electrode.

7. The semiconductor memory device of claim 1, wherein the first and second chalcogenide compound layers include tellurium (Te) or selenium (Se) and germanium (Ge), antimony (Sb), bismuth (Bi), aluminum (Al), lead (Pb), tin (Sn), silver (Ag), arsenic (As), sulfur (S), silicon (Si), indium (In), titanium (Ti), gallium (Ga), or phosphorus (P).

8. The semiconductor memory device of claim 1, wherein the conductive nano-dots include tellurium (Te), arsenic (As), silver (Ag), ruthenium (Ru), titanium (Ti), tantalum (Ta), tungsten (W), aluminum (Al), silicon (Si), or germanium (Ge).

9. The semiconductor memory device of claim 1, wherein the variable resistance memory elements include chalcogen compounds, perovskite compounds, transition metal oxides, ferromagnetic materials, or anti-ferromagnetic materials.

10. A semiconductor memory device, comprising:
first lines and second lines overlapping and intersecting each other;
variable resistance memory elements disposed at intersections between the first lines and the second lines; and
threshold switching elements disposed between the variable resistance memory elements and the first lines,
wherein the threshold switching elements include conductive nano-dots, and
wherein the conductive nano-dots are spaced apart from a pair of electrodes.

11. The semiconductor memory device of claim 10, wherein
at least one of the threshold switching elements is disposed between the electrodes.

12. The semiconductor memory device of claim 10, wherein
the threshold switching elements comprise a chalcogenide compound, and
the conductive nano-dots comprise an element of the chalcogenide compound.

13. The semiconductor memory device of claim 12, wherein
the chalcogenide compound includes tellurium (Te) or selenium (Se) and germanium (Ge), antimony (Sb), bismuth (Bi), aluminum (Al), lead (Pb), tin (Sn), silver (Ag), arsenic (As), sulfur (S), silicon (Si), indium (In), titanium (Ti), gallium (Ga), or phosphorus (P), and
the conductive nano-dots comprise tellurium (Te) nano-dots.

14. The semiconductor memory device of claim 10, wherein
at least one of the threshold switching elements comprises first and second chalcogenide compound layers that are sequentially stacked, and
the conductive nano-dots are positioned at an interface between the first and second chalcogenide compound layers.

15. The semiconductor memory device of claim 14, wherein the first and second chalcogenide compound layers comprise nitrogen, the first chalcogenide compound layer including a nitrogen concentration greater than a nitrogen concentration of the second chalcogenide compound layer.

16. A semiconductor memory device, comprising:
first lines and second lines overlapping and intersecting each other, wherein the second lines are disposed above the first lines;
variable resistance memory elements disposed at intersections between the first lines and the second lines; and
switching elements disposed between the variable resistance memory elements and the first lines,
wherein at least one of the switching elements comprises:
first, second, and third chalcogenide compound layers;
first conductive nano-dots disposed between the first and second chalcogenide compound layers; and
second conductive nano-dots disposed between the second and third chalcogenide compound layers.

17. The semiconductor memory device of claim 16, wherein the first to third chalcogenide compound layers comprise nitrogen, the first and second chalcogenide compound layers including a nitrogen concentration greater than a nitrogen concentration of the third chalcogenide compound layer.

18. The semiconductor memory device of claim 17, wherein the first and second chalcogenide compound layers have a nitrogen concentration in a range of from about 3.0% to about 5.0%, and the third chalcogenide compound layer has a nitrogen concentration in a range of from about 1.0% to about 2.0%.

19. The semiconductor memory device of claim 16, wherein a thickness of the third chalcogenide compound layer is greater than a thickness of the first and second chalcogenide compound layers.

20. The semiconductor memory device of claim 16, wherein the first and second conductive nano-dots comprise tellurium (Te) nano-dots.

* * * * *